(12) United States Patent
Kar-Roy et al.

(10) Patent No.: US 9,887,123 B2
(45) Date of Patent: Feb. 6, 2018

(54) STRUCTURE HAVING ISOLATED DEEP SUBSTRATE VIAS WITH DECREASED PITCH AND INCREASED ASPECT RATIO AND RELATED METHOD

(71) Applicant: Newport Fab, LLC, Newport Beach, CA (US)

(72) Inventors: Arjun Kar-Roy, Irvine, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/886,347

(22) Filed: Oct. 19, 2015

(65) Prior Publication Data

US 2016/0118339 A1    Apr. 28, 2016

Related U.S. Application Data

(60) Provisional application No. 62/068,220, filed on Oct. 24, 2014.

(51) Int. Cl.
*H01L 21/74* (2006.01)
*H01L 23/48* (2006.01)
*H01L 21/768* (2006.01)

(52) U.S. Cl.
CPC ........ *H01L 21/74* (2013.01); *H01L 21/76898* (2013.01); *H01L 23/481* (2013.01); *H01L 21/76801* (2013.01); *H01L 21/76831* (2013.01); *H01L 2924/0002* (2013.01)

(58) Field of Classification Search
CPC ............. H01L 23/481; H01L 21/76898; H01L 21/76802
See application file for complete search history.

(56) References Cited

U.S. PATENT DOCUMENTS

| | | | | |
|---|---|---|---|---|
| 5,618,752 A | * | 4/1997 | Gaul | H01L 21/743 257/E21.538 |
| 8,530,820 B2 | * | 9/2013 | Matsunuma | H01L 27/14609 250/214 DC |
| 9,287,166 B2 | * | 3/2016 | Yu | H01L 21/76898 |
| 2003/0203546 A1 | * | 10/2003 | Burbach | H01L 21/743 438/151 |
| 2007/0197013 A1 | * | 8/2007 | Trezza | H01L 21/6835 438/597 |

* cited by examiner

*Primary Examiner* — Allen Parker
(74) *Attorney, Agent, or Firm* — Bever, Hoffman & Harms, LLP

(57) ABSTRACT

A structure having isolated deep substrate vias with decreased pitch and increased aspect ratio is disclosed. The structure includes a device layer over a buried oxide layer, a deep trench extending through the device layer, a dielectric filler in the deep trench, via holes in the dielectric filler, and conductive fillers in the via holes being the isolated deep substrate vias. The dielectric filler may include silicon oxide. The conductive fillers may include tungsten or copper. An adjacent pair of the isolated deep substrate vias within the deep trench has a pitch equal to or less than 1.0 microns.

13 Claims, 16 Drawing Sheets

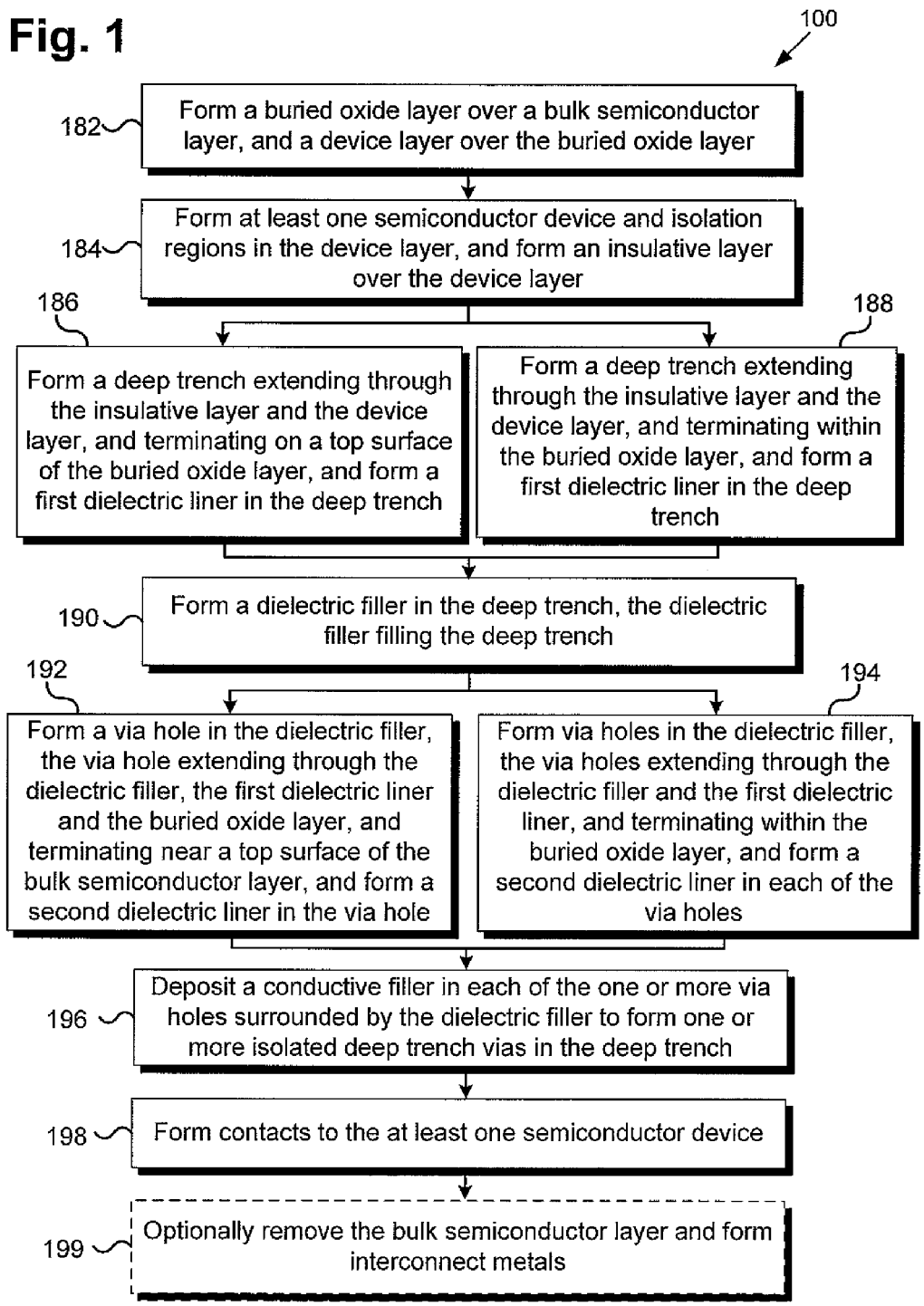

STRUCTURE HAVING ISOLATED DEEP SUBSTRATE VIAS WITH DECREASED PITCH AND INCREASED ASPECT RATIO AND RELATED METHOD

The present application claims the benefit of and priority to a provisional patent application entitled "Fine-Pitch Isolated Deep Silicon Vias," Ser. No. 62/068,220 filed on Oct. 24, 2014. The disclosure in this provisional application is hereby incorporated fully by reference into the present application.

BACKGROUND

Three dimensional (3D) integrated circuit stacking has gained popularity as an integration scheme over conventional two dimensional processes in recent years as it offers benefits such as small footprint and improved performance. For example, 3D integrated circuit stacking involves stacking semiconductor wafers and/or dies, and interconnecting them vertically using vias, such as through substrate vias (TSVs). The 3D stacking of complementary bipolar complementary-metal-oxide semiconductor (BiCMOS), mixed-signal/CMOS, radio frequency ("RF") CMOS, and CMOS image sensor technologies formed on semiconductor dies and/or wafers requires a large number of via connections at different levels. In imaging applications, for example, every pixel in an imaging array needs at least one via for making an electrical connection. Thus, it is important for TSVs to have reduced pitches and high aspect ratios.

A conventional method of forming a TSV involves etching a hole in a substrate, lining the sidewalls of the hole with an isolation material, and filling the hole with a conductive material. Since the substrate may include several layers, etching a hole through different layers of the substrate may require different etching chemistries and/or methods. As a result, TSVs formed using the conventional method typically have a critical dimension (CD) width of at least 10 microns (i.e., $10*10^{-6}$ meters). Also, a pitch, which is the separation between the middle of one TSV and the middle of an adjacent TSV, is typically 10 microns or larger. TSVs with large pitches and low aspect ratios require semiconductor dies with large footprints, which may be undesirable for certain applications.

Thus, there is a need in the art for a structure having substrate vias with decreased pitch and increased aspect ratio.

SUMMARY

The present disclosure is directed to a structure having isolated deep substrate vias with decreased pitch and increased aspect ratio and related method, substantially as shown in and/or described in connection with at least one of the figures, and as set forth in the claims.

BRIEF DESCRIPTION OF THE DRAWINGS

FIG. 1 is a flowchart illustrating methods of forming a structure having one or more isolated deep substrate vias with decreased pitch and increased aspect ratio according to implementations of the present application.

DETAILED DESCRIPTION

Figure 2A:
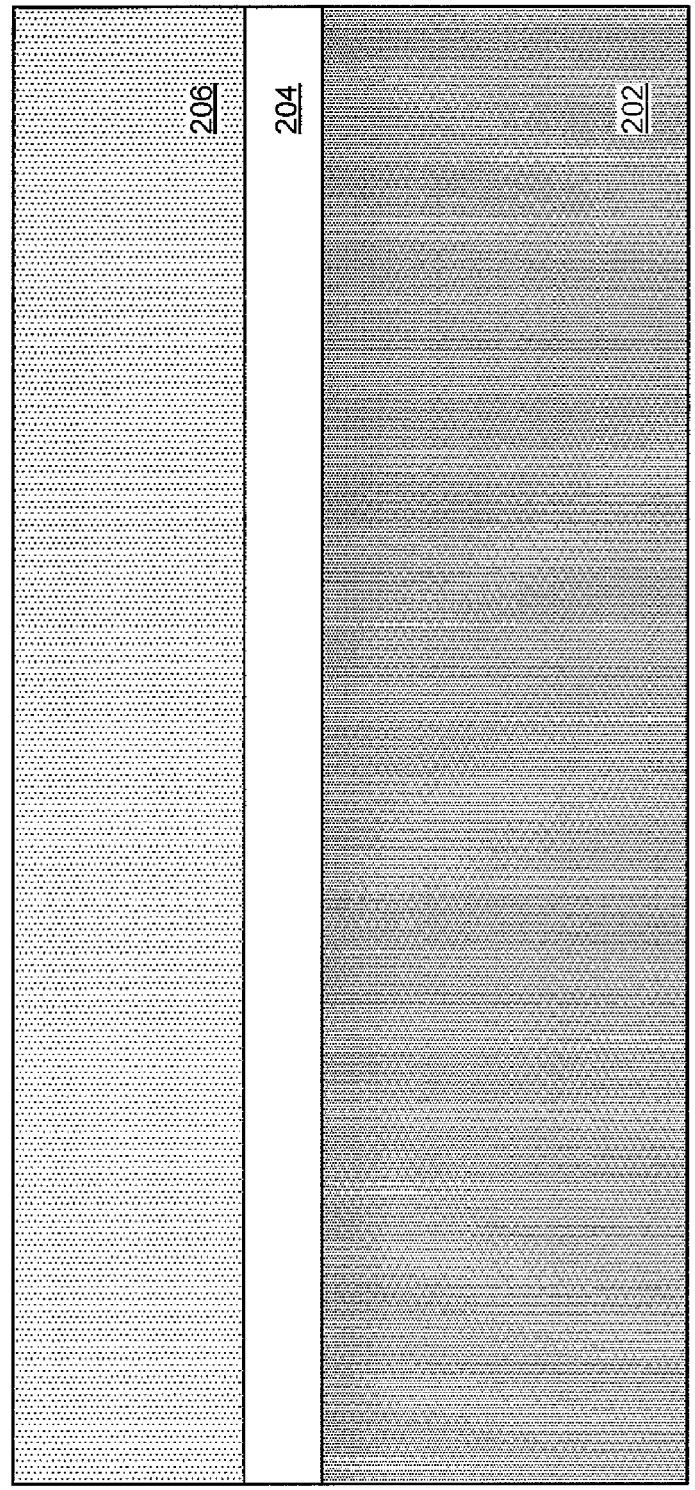
FIG. 2A illustrates a cross-sectional view of a portion of a structure having an isolated deep substrate via with decreased pitch and increased aspect ratio processed in accordance with an initial action in the flowchart of FIG. 1 according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating exemplary methods of forming a structure having one or more isolated deep substrate vias with decreased pitch and increased aspect ratio according to implementations of the present inventive concepts. Certain details and features have been left out of flowchart 100 that are apparent to a person of ordinary skill in the art. For example, an action may consist of one or more subactions or may involve specialized equipment or materials, as known in the art. Actions 182, 184, 186, 190, 192, 196 and 198 indicated in flowchart 100 are sufficient to describe one implementation of the present inventive concepts. Actions 182, 184, 188, 190, 194, 196 and 198 indicated in flowchart 100 are sufficient to describe another implementation of the present inventive concepts. Other implementations of the present inventive concepts may utilize actions different from those shown in flowchart 100.

In FIGS. 2A through 2H, structures 282, 284, 286, 290, 292, 296, 298 and 299 illustrate the results of performing actions 182, 184, 186, 190, 192, 196, 198 and 199 of flowchart 100, respectively. For example, structure 282 is a portion of a structure having an isolated deep substrate via with decreased pitch and increased aspect ratio after the processing of action 182, structure 284 is an exemplary structure after the processing of action 184, structure 286 is an exemplary structure after the processing of action 186, and so forth.

Referring to action 182 in FIG. 1 and structure 282 in FIG. 2A, action 182 includes forming a buried oxide layer over a bulk semiconductor layer and a device layer over the buried oxide layer. As illustrated in FIG. 2A, structure 282 includes buried oxide layer 204 over bulk semiconductor layer 202, and device layer 206 over buried oxide layer 204. Bulk semiconductor layer 202 is situated below buried oxide layer 204, and includes semiconductor material such as silicon. Bulk semiconductor layer 202 may be part of a handle wafer. Buried oxide layer 204 is situated over bulk semiconductor layer 202, and includes an insulative material such as silicon oxide. Device layer 206 is situated over buried oxide layer 204, and includes semiconductor material such as silicon.

In the present implementation, in contrast to conventional thin SOT (silicon-on-insulator) structures having a device layer of less than 0.5 microns thick, structure 282 is a thick film SOI semiconductor structure where the thickness of device layer 206 is at least 1.0 microns. In other implementations, device layer 206 may have a thickness of any desired value to suit the specific needs of a particular application. It is desirable to build semiconductor devices in a thick film SOI semiconductor structure because it allows bulk silicon wafer design methodologies and design models, which take into account existence of certain amount of junction capacitance based on, for example, transistor sizes, device geometries and other factors, to be used. By contrast, thin film SOI semiconductor structures have electrical and other characteristics that significantly differ from those of a bulk silicon wafer, such that the bulk silicon wafer design methodologies and design models must be re-developed, which can introduce additional development costs and inefficiencies in the design and fabrication of these thin film SOI structures.

Structure 282, having bulk semiconductor layer 202, buried oxide layer 204 and device layer 206, can be formed by using any suitable methods. In one implementation, structure 282 may be formed by growing an oxide layer on a silicon wafer, growing an oxide layer on another silicon wafer, placing the oxide layers in contact with each other, annealing the oxide layers together, and grinding a reverse side of one of the silicon wafers to produce a silicon-on-insulator (SOI) wafer having a device layer with a desired thickness. In another implementation, structure 282 may be formed by growing an oxide layer on a silicon wafer, growing an oxide layer on another silicon wafer, implanting hydrogen, placing the two silicon wafers together, and thermally shocking the resulting assembly to produce a SOI wafer having a device layer with a desired thickness. In yet another implementation, structure 282 may be formed by growing buried oxide layer on a bulk semiconductor layer and depositing a device layer on the buried oxide layer.

Figure 2B:
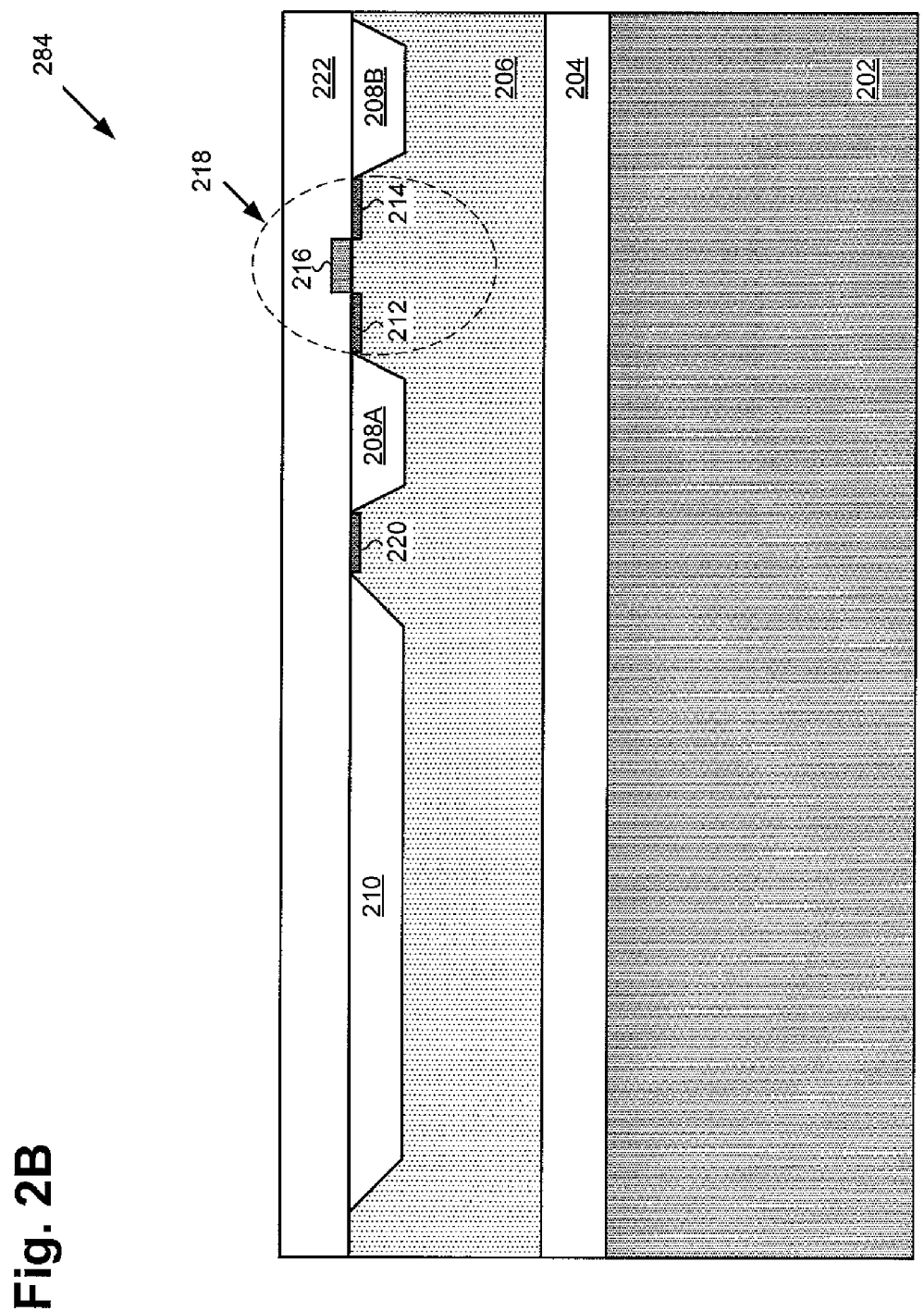
FIG. 2B illustrates a cross-sectional view of a portion of a structure having an isolated deep substrate via with decreased pitch and increased aspect ratio processed in accordance with an intermediate action in the flowchart of FIG. 1 according to one implementation of the present application.

Referring to action 184 in FIG. 1 and structure 284 in FIG. 2B, action 184 includes forming at least one semiconductor device and isolation regions in the device layer, and forming an insulative layer over the device layer. As illustrated in FIG. 2B, structure 284 includes active semiconductor device 218, passive semiconductor device 220, and isolation regions 208A, 208B and 210 in device layer 206. Structure 284 also includes insulative layer 222 over device layer 206.

In one implementation, active semiconductor device 218 is a field-effect transistor (FET) of a CMOS device. As illustrated in FIG. 2B, active semiconductor device 218 includes source 212, drain 214 and gate 216, for example. In other implementations, active semiconductor device 218 may include an insulated-gate bipolar transistor (IGBT) or other suitable active semiconductor devices. In one implementation, passive semiconductor device 220 may include a resistive, capacitive or inductive element, for example. Isolation regions 208A, 208B and 210 are situated in device layer 206, and may include shallow trench isolation (STI) regions having field oxide, such as silicon oxide. Isolation regions 208A, 208B and 210 are configured to electrically isolate semiconductor devices, such as active semiconductor device 218 and passive semiconductor device 220 formed in device layer 206. In another implementation, structure 284 may not contain any active semiconductor devices in device layer 206, but may contain passive semiconductor devices beyond insulative layer 222 and made up of backend metal and via structures such as metal-insulator-metal capacitors, metal resistors, inductors, metal fan-outs, and etc. For example, structure 284 may be an integrated passive device (IPD) wafer having back metal layers and metal-insulator-metal capacitors.

As illustrated in FIG. 2B, insulative layer 222 is formed over device layer 206 and covering active semiconductor device 218, passive semiconductor device 220, and isolation regions 208A, 208B and 210. In one implementation, insulative layer 222 may include silicon oxide. In other implementations, insulative layer 222 may include other suitable insulative materials, such as silicon nitride.

Figure 2C:
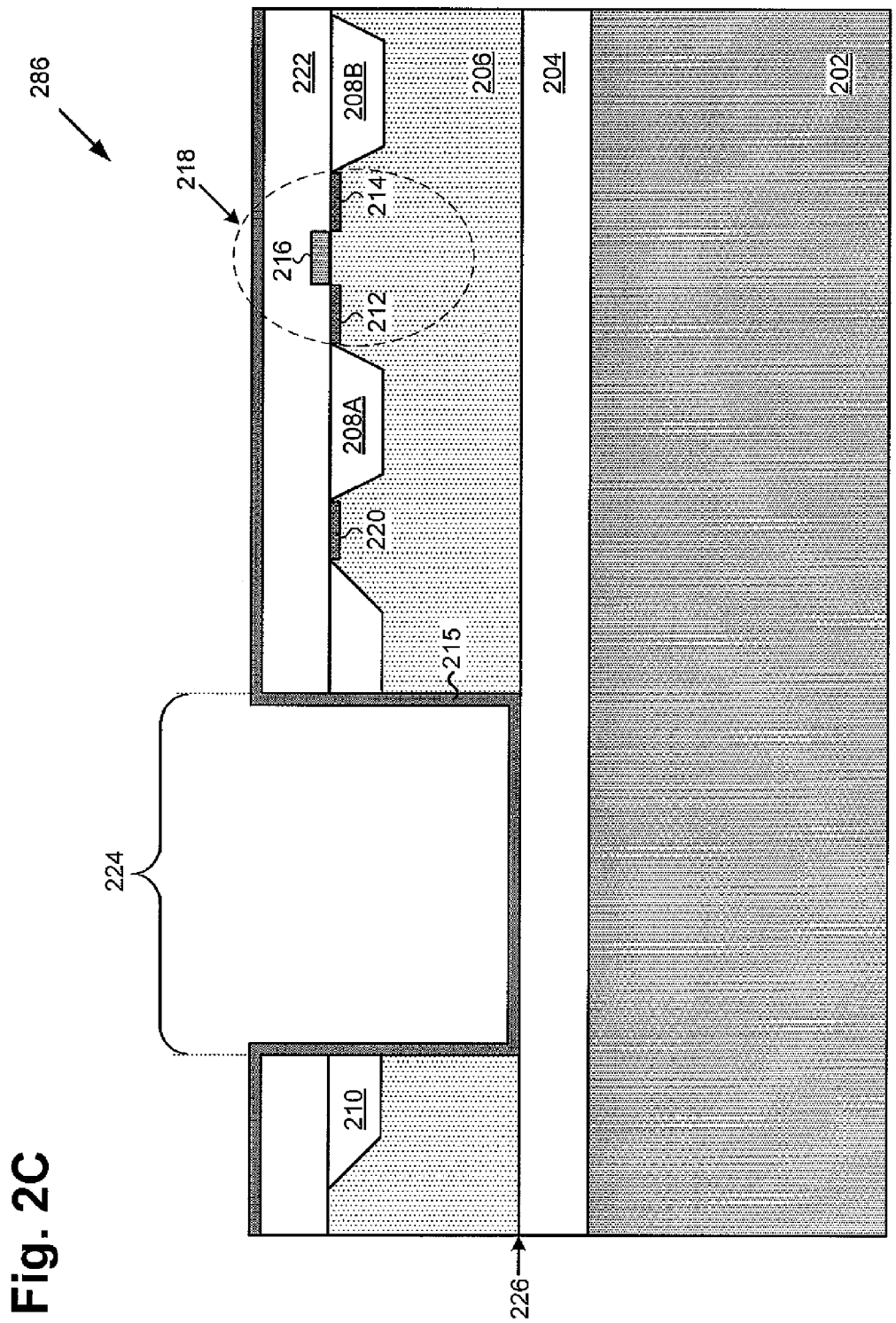
FIG. 2C illustrates a cross-sectional view of a portion of a structure having an isolated deep substrate via with decreased pitch and increased aspect ratio processed in accordance with an intermediate action in the flowchart of FIG. 1 according to one implementation of the present application.

Referring to action 186 in FIG. 1 and structure 286 in FIG. 2C, action 186 includes forming a deep trench extending through the insulative layer and the device layer, and terminating on a top surface of the buried oxide layer, and forming a first dielectric liner in the deep trench. As illustrated in FIG. 2C, structure 286 includes deep trench 224 extending through insulative layer 222, isolation region 210 and device layer 206, and terminating on top surface 226 of buried oxide layer 204. In the present implementation, deep trench 224 has substantially parallel sidewalls and a flat bottom. As illustrated in FIG. 2C, active semiconductor device 218 and passive semiconductor device 220 are adjacent to deep trench 224.

For example, deep trench 224 can be formed by removing (e.g., etching away or cutting) portions of insulative layer 222, isolation region 210, and device layer 206. It should be understood that the formation of deep trench 224 may involve using different etchants and/or methods to remove portions of each of insulative layer 222, isolation region 210 and device layer 206. Also, during the various etching actions, one or more deep trench masks (not explicitly shown in FIG. 2C) may be used to mask portions of insulative layer 222 over active semiconductor device 218, passive semiconductor device 220, isolation regions 208A and 208B, and portions of isolation region 210. After one or more etching actions, wet cleans may be performed to ensure that structure 286 has smooth and clean surfaces free from residues, impurities and other unwanted material.

As illustrated in FIG. 2C, structure 286 includes first dielectric liner 215 formed in deep trench 224. First dielectric liner 215 lines the sidewalls and the bottom of deep trench 224. In the present implementation, first dielectric liner 215 is an oxide liner, such as a tetraethylorthosilicate (TEOS) liner. First dielectric liner 215 is configured to provide reliable isolation between a subsequently formed isolated deep substrate via and one or more wells (not explicitly shown in FIG. 2C), for example, of active semiconductor device 218 in device layer 206. In the present implementation, first dielectric liner 215 has a thickness in a range between 500-1000 angstroms (i.e., $500\text{-}1000*10^{-10}$ meters). In another implementation, first dielectric liner 215 may have a thickness less than 500 angstroms or greater than 1000 angstroms.

Figure 2D:
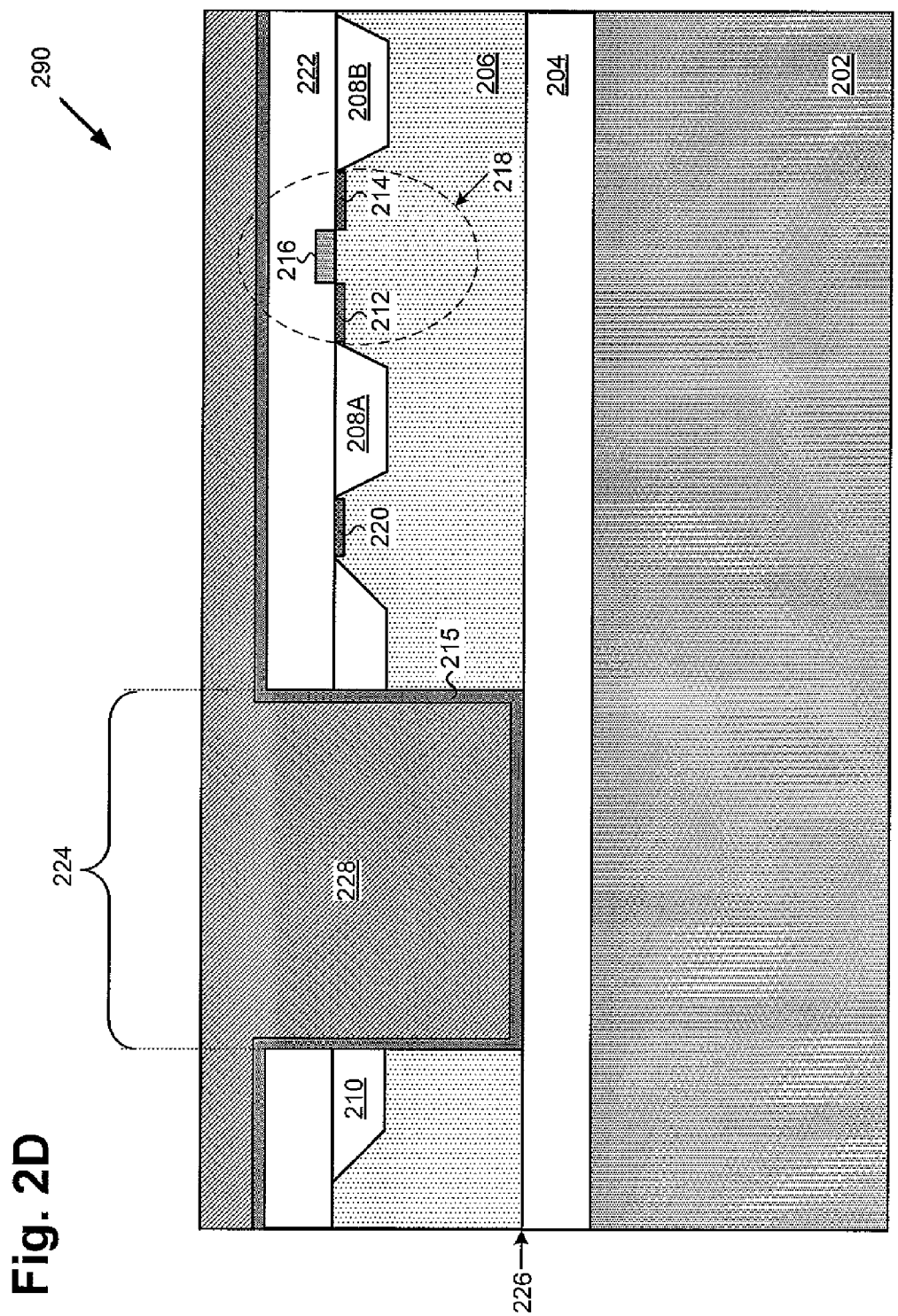
FIG. 2D illustrates a cross-sectional view of a portion of a structure having an isolated deep substrate via with decreased pitch and increased aspect ratio processed in accordance with an intermediate action in the flowchart of FIG. 1 according to one implementation of the present application.

Referring to action 190 in FIG. 1 and structure 290 in FIG. 2D, action 190 includes forming a dielectric filler in the deep trench, the dielectric filler filling the deep trench. As illustrated in FIG. 2D, structure 290 includes dielectric filler 228 formed over first dielectric liner 215 in deep trench 224 and over the top surface of insulative layer 222, where dielectric filler 228 fills the entire space in deep trench 224. Dielectric filler 228 may be formed by depositing an oxide using deposition methods such as chemical vapor deposition (CVD), high density plasma CVD, low pressure CVD, thermal CVD, or spin-coating, for example. In the present implementation, dielectric filler 228 includes silicon oxide or boron phosphorous doped tetraethylorthosilicate (TEOS). In other implementations, dielectric filler 228 may include other suitable dielectric materials. Dielectric filler 228 can provide mechanical rigidity for conductive fillers subsequently deposited in via holes formed therein.

Figure 2E:
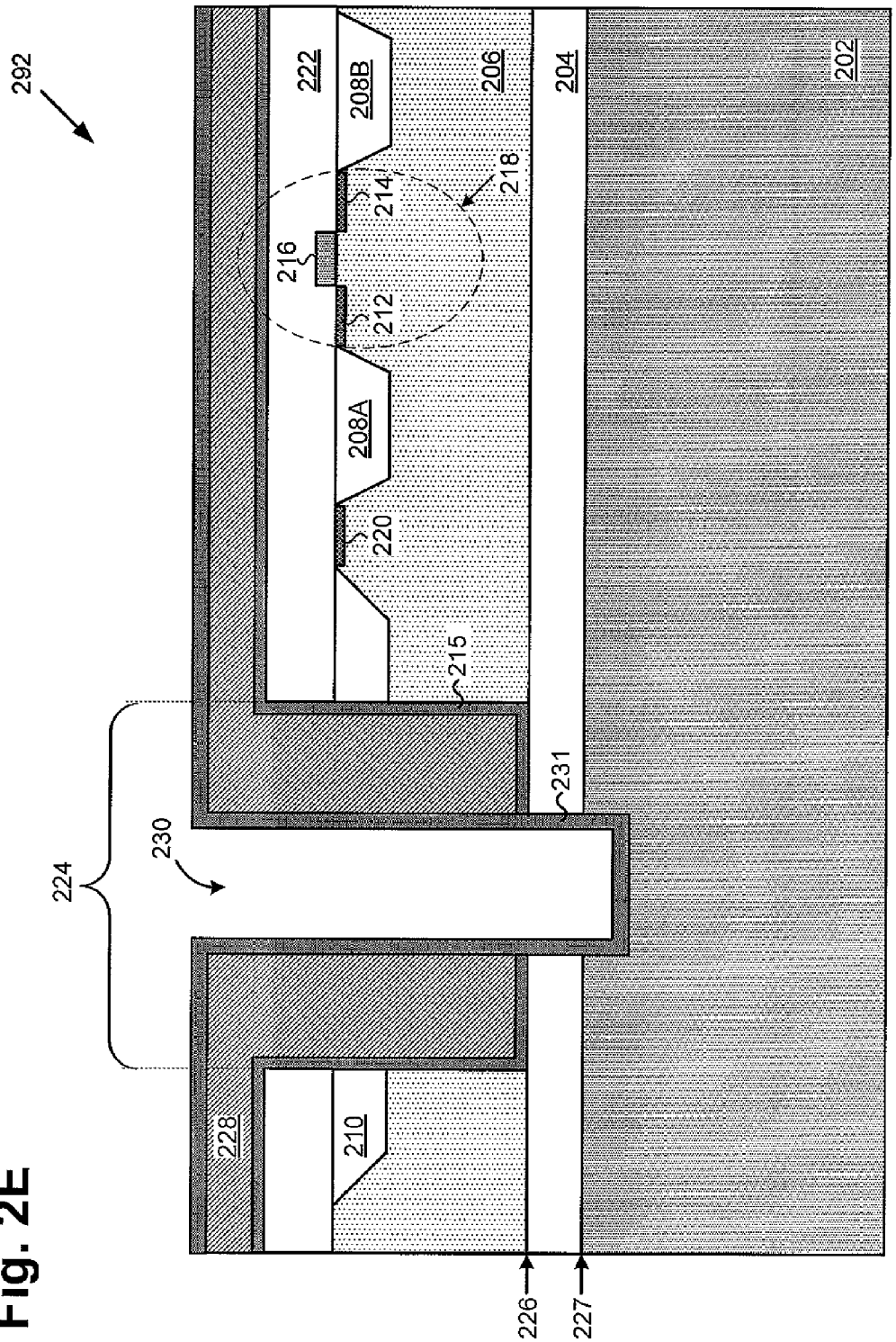
FIG. 2E illustrates a cross-sectional view of a portion of a structure having an isolated deep substrate via with decreased pitch and increased aspect ratio processed in accordance with an intermediate action in the flowchart of FIG. 1 according to one implementation of the present application.

Referring to action 192 in FIG. 1 and structure 292 in FIG. 2E, action 192 includes forming a via hole in the dielectric filler, the via hole extending through the dielectric filler, the first dielectric liner and the buried oxide layer, and terminating near a top surface of the bulk semiconductor layer, and forming a second dielectric liner in the via hole. As illustrated in FIG. 2E, structure 292 includes via hole 230 in dielectric filler 228, and second dielectric liner 231 in via hole 230. Via hole 230 extends through dielectric filler 228, first dielectric liner 215 and buried oxide layer 204, and terminates near top surface 227 of bulk semiconductor layer 202. In the present implementation, via hole 230 extends into bulk semiconductor layer 202 and terminates slight below top surface 227 of bulk semiconductor layer 202. In another implementation, via hole 230 may terminate on or above top surface 227 of bulk semiconductor layer 202. For example, via hole 230 may be formed by removing (e.g., etching away or cutting) portions of dielectric filler 228, first dielectric liner 215, buried oxide layer 204 and bulk semiconductor layer 202.

In contrast to conventional methods using different etchants and/or methods to remove different portions of a substrate having different compositions to form via holes, in the present implementation, because dielectric filler 228 in deep trench 224, first dielectric liner 215, buried oxide layer 204 have substantially similar compositions, in the present implementation, the etching process can be well controlled to form via holes with fine dimensions. In the present implementation, via hole 230 may have a critical dimension width of approximately equal to or less than 1.0 microns, and a critical dimension depth of approximately equal to or greater than 5.0 microns, such that an isolated deep substrate via subsequently formed in via hole 230 may have a high aspect ratio of approximately equal to or greater than 5:1. In the present implementation, via hole 230 may include substantially parallel sidewalls and a flat bottom. After one or more etching actions, wet cleans may be performed to ensure that via hole 230 has smooth and clean surfaces free from residues, impurities and other unwanted material.

Thereafter, second dielectric liner 231 is formed in via hole 230 and over a top surface of dielectric filler 228. Second dielectric liner 231 lines the sidewalls and the bottom of via hole 230. In the present implementation, second dielectric liner 231 is an oxide liner, such as a tetraethylorthosilicate (TEOS) liner. Second dielectric liner 231 is configured to provide reliable isolation between a subsequently formed isolated deep substrate via and one or more wells (not explicitly shown in FIG. 2E), for example, of active semiconductor device 218 in device layer 206. In the present implementation, second dielectric liner 231 has a thickness in a range between 500-1000 angstroms (i.e., $500\text{-}1000*10^{10}$ meters). In another implementation, second dielectric liner 231 may have a thickness less than 500 angstroms or greater than 1000 angstroms.

Figure 2F:
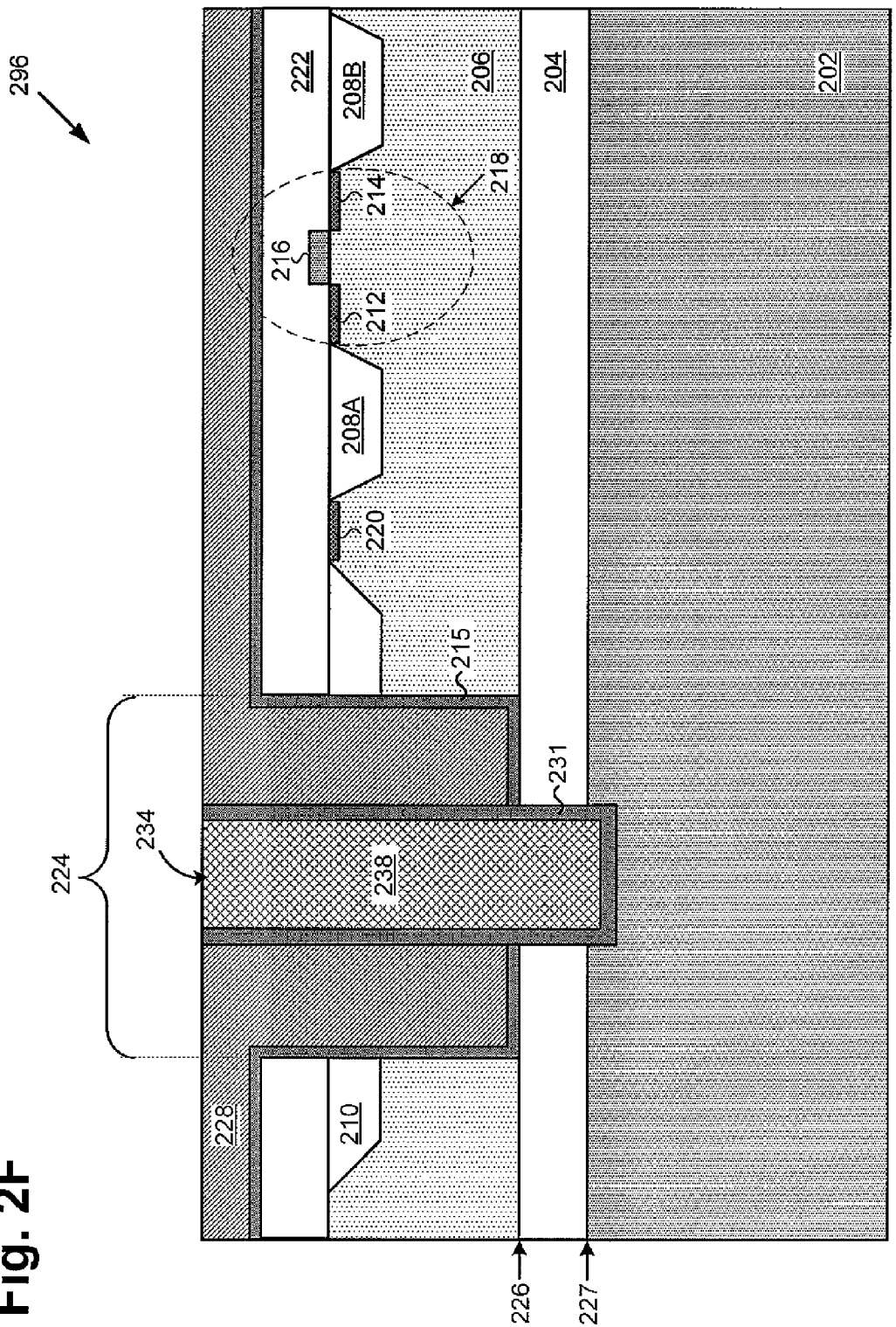
FIG. 2F illustrates a cross-sectional view of a portion of a structure having an isolated deep substrate via with decreased pitch and increased aspect ratio processed in accordance with an intermediate action in the flowchart of FIG. 1 according to one implementation of the present application.

Referring to action 196 in FIG. 1 and structure 296 in FIG. 2F, action 196 includes depositing a conductive filler in the via hole surrounded by the dielectric filler to form an isolated deep substrate via in the deep trench. As illustrated in FIG. 2F, structure 296 includes conductive filler 238 deposited in via hole 230. In the present implementation, conductive filler 238 in via hole 230 is in direct contact with second dielectric liner 231 in via hole 230, and surrounded by dielectric filler 228 in deep trench 224, thus forming isolated deep substrate via 234. In the present implementation, conductive filler 238 includes a metallic material, such as tungsten or copper. In other implementations, conductive filler 238 in via hole 230 may include other suitable conductive materials. Second dielectric liner 231 may be completely removed from the top surface of dielectric filler 228 during the formation of conductive filler 238 using processing actions such as chemical mechanical polishing (CMP).

Figure 2G:
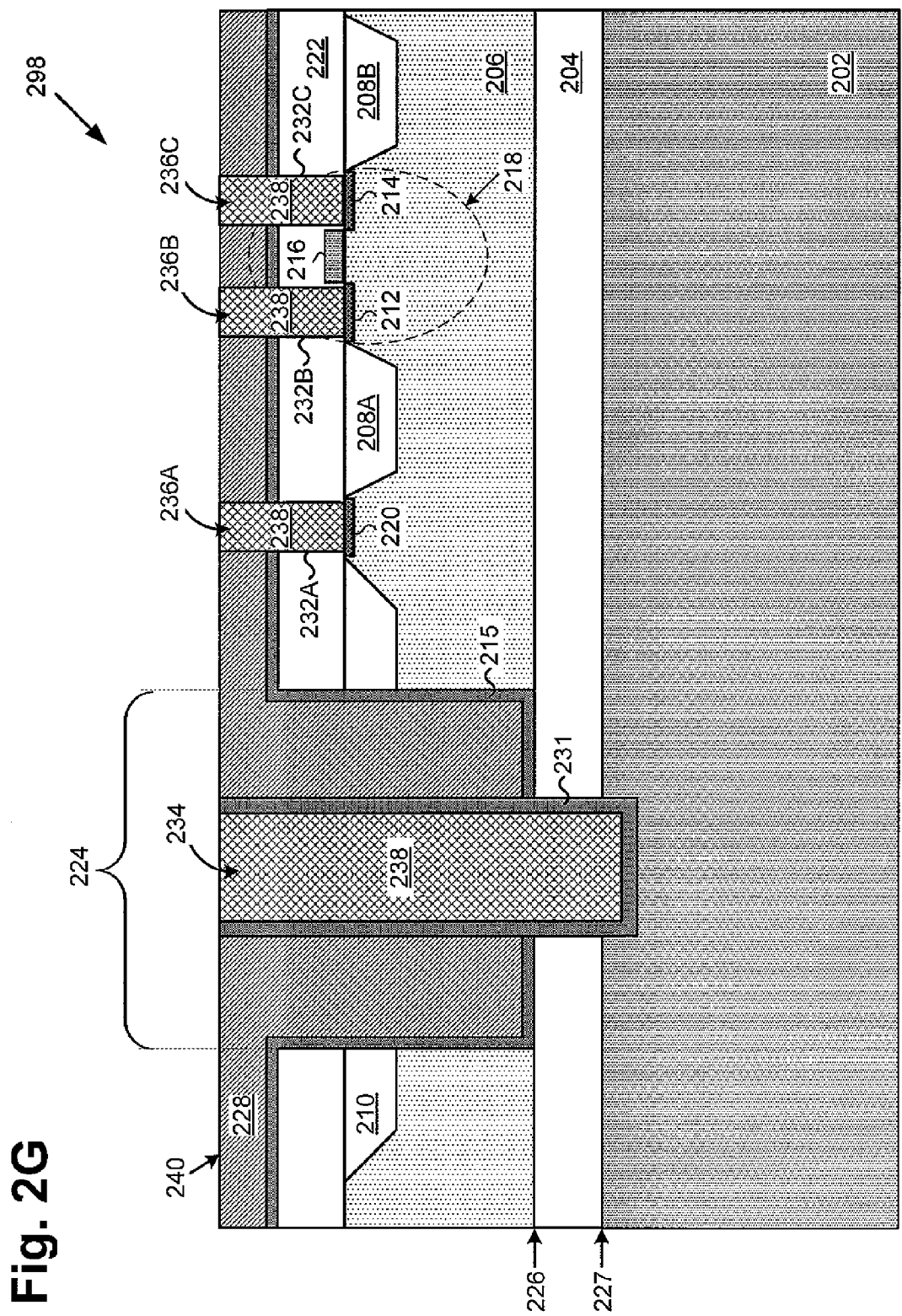
FIG. 2G illustrates a cross-sectional view of a portion of a structure having an isolated deep substrate via with decreased pitch and increased aspect ratio processed in accordance with an intermediate action in the flowchart of FIG. 1 according to one implementation of the present application.

Referring to action 198 in FIG. 1 and structure 298 in FIG. 2G, action 198 includes forming contacts for one or more semiconductor devices in the device layer. As illustrated in FIG. 2G, structure 298 includes contact 236A for passive semiconductor device 220, and contacts 236B and 236C for active semiconductor device 218. Contact hole 232A extends through dielectric filler 228, first dielectric liner 215 and insulative layer 222, and reaches a top surface of passive semiconductor device 220. Contact holes 232B and 232C extend through dielectric filler 228, first dielectric liner 215 and insulative layer 222, and reach respective top surfaces of source 212 and drain 214 of active semiconductor device 218. It is noted that the formation of contact holes 232A, 232B and 232C may require a different mask than the one used to form via hole 230. After one or more etching actions, wet cleans may be performed to ensure that contact holes 232A, 232B and 232C have smooth and clean surfaces free from residues, impurities and other unwanted material.

As illustrated in FIG. 2G, conductive fillers 238 are deposited in contact holes 232A, 232B and 232C. In the present implementation, conductive fillers 238 in contact holes 232A, 232B and 232C are in direct contact with passive semiconductor device 220, source 212 and drain 214 of active semiconductor device 218, respectively. Conductive fillers 238 in contact holes 232A, 232B and 232C are isolated from one another by dielectric filler 228, first dielectric liner 215 and insulative layer 222, thus forming respective contacts 236A, 236B and 236C.

In the present implementation, conductive fillers 238 in contact holes 232A, 232B and 232C each include a metallic material, such as tungsten or copper. In the present implementation, conductive filler 238 in via hole 230 and conductive fillers 238 in contact holes 232A, 232B and 232C are formed in different deposition actions, and may include different conductive materials. In another implementation, conductive filler 238 in via hole 230 and conductive fillers 238 in contact holes 232A, 232B and 232C may be deposited during a single deposition action using the same conductive material. A chemical mechanical polish (CMP) and cleaning may be carried out to remove excess conductive fillers 238 as well as one or more photoresist masks (not explicitly shown in FIG. 2G) used during the deposition of conductive fillers 238. As illustrated in FIG. 2G, isolated deep substrate via 234, second dielectric liner 231, contacts 236A, 236B and 236C and dielectric filler 228 have coplanar top surface 240.

In another implementation, once via hole 230 is formed in structure 292 in FIG. 2E, where via hole 230 extends through dielectric filler 228, first dielectric liner 215 and buried oxide layer 204, and terminates near top surface 227 of bulk semiconductor layer 202, conductive filler 238 is deposited in via hole 230. A CMP action may be performed to planarize conductive filler 238 in via hole 230. Thereafter, contact holes 232A, 232B and 232C may be formed, for example, by etching through dielectric filler 228, first dielectric liner 215 and insulative layer 222, to reach the respective top surfaces of passive semiconductor device 220, and source 212 and drain 214 of active semiconductor device 218. Thereafter, conductive fillers 238 are formed in contact holes 232A, 232B and 232C, which are then polished by another CMP action to form structure 298 in FIG. 2G.

In yet another implementation, once via hole 230 is formed in structure 292 in FIG. 2E, contact holes 232A, 232B and 232C may be formed, for example, by etching through dielectric filler 228, first dielectric liner 215 and insulative layer 222, to reach the respective top surfaces of passive semiconductor device 220, and source 212 and drain 214 of active semiconductor device 218. Thereafter, conductive fillers 238 are formed in via hole 230 and contact holes 232A, 232B and 232C in a single action, then polished by a CMP action to form structure 298 in FIG. 2G.

Figure 2H:
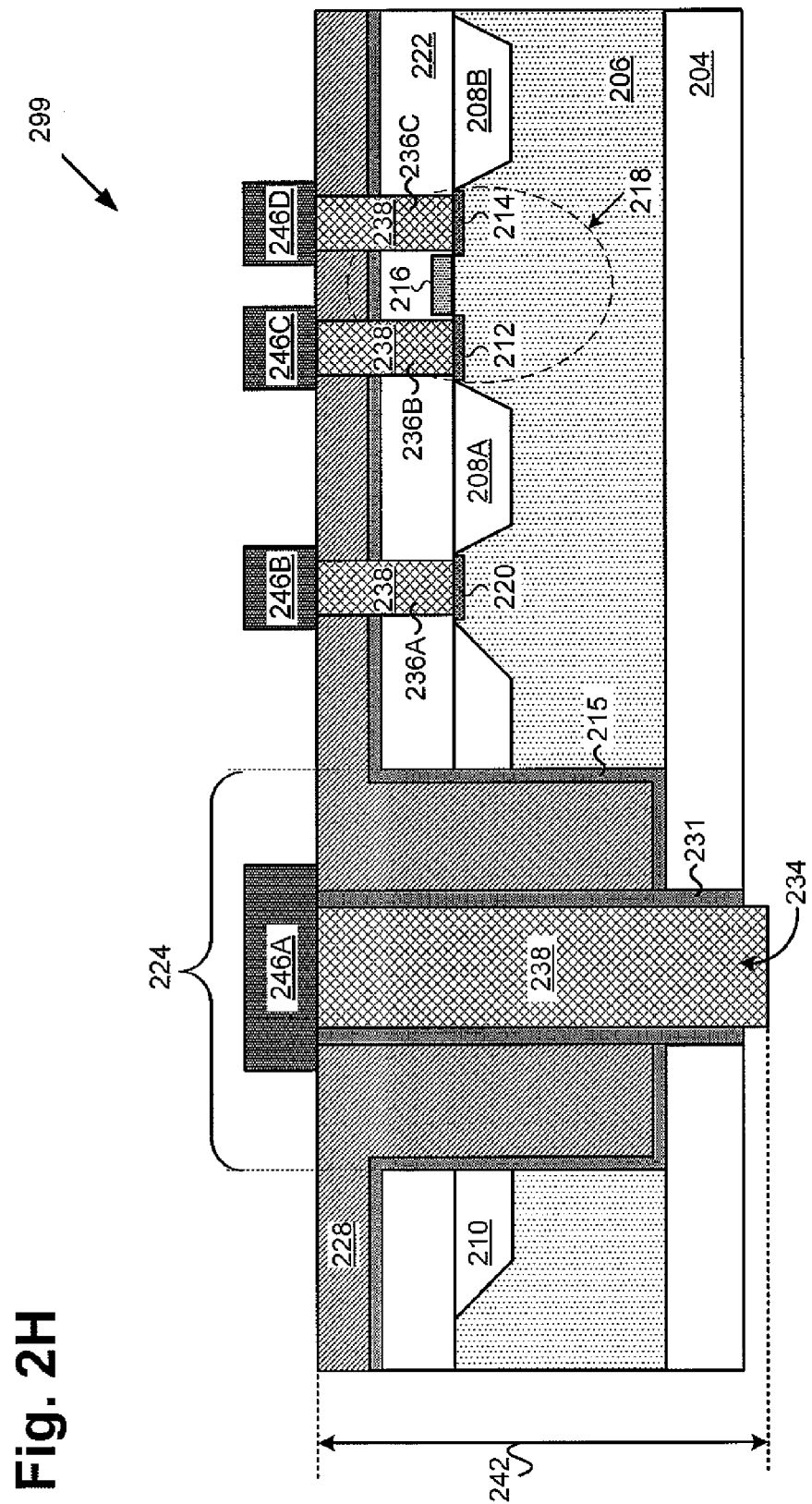
FIG. 2H illustrates a cross-sectional view of a portion of a structure having an isolated deep substrate via with decreased pitch and increased aspect ratio processed in accordance with a final action in the flowchart of FIG. 1 according to one implementation of the present application.

Referring to action 199 in FIG. 1 and structure 299 in FIG. 2H, action 199 includes optionally removing the bulk semiconductor layer and forming interconnect metals. As illustrated in FIG. 2H, structure 299 includes buried oxide layer 204, device layer 206 formed over buried oxide layer 204, isolation regions 208A, 208B and 210, active semiconductor device 218 and passive semiconductor device 220 formed in device layer 206, insulative layer 222 over device layer 206, isolated deep substrate via 234 surrounded by second dielectric liner 231, dielectric filler 228 and first dielectric liner 215 in deep trench 224, and contacts 236A, 236B and 236C coupled to passive semiconductor device 220, source 212 and drain 214 of active semiconductor device 218, respectively, and interconnect metals 246A, 246B, 246C and 246D. Bulk semiconductor layer 202 in structure 298 of FIG. 2G is removed from structure 299 in FIG. 2H. It should be understood that, in a case where structure 298 in FIG. 2H is a SOI wafer at the bottom of a 3D stacked structure, bulk semiconductor layer 202 does not need to be removed from structure 298 of FIG. 2G.

In one implementation, bulk semiconductor layer 202 can be removed by etching from the bottom of structure 298 in FIG. 2G, where buried oxide layer 204 can act as an etch stop layer and protect device layer 206. In another implementation, bulk semiconductor layer 202 can be removed by grinding the bottom surface of bulk semiconductor layer 202 in structure 298 in FIG. 2G, for example using coarse removal methods such as grinding wheel for mechanical polishing and followed by fine removal methods such as wet or dry chemical processing to expose the bottom of conductive filler 238 of isolated deep substrate via 234. As illustrated in FIG. 2H, isolated deep substrate via 234 extends through the entire thickness of structure 299 such that isolated deep substrate via 234 is exposed at both the top and bottom surfaces of structure 299.

As illustrated in FIG. 2H, in the present implementation, isolated deep substrate via 234 extends slightly below the bottom surface of buried oxide layer 204. In another implementation, isolated deep substrate via 234 may have a coplanar bottom surface with buried oxide layer 204. In one implementation, structure 299 can be stacked with other semiconductor dies and/or wafers (not explicitly shown in FIG. 2H) on its top and/or bottom surfaces, where isolated deep substrate via 234 is configured to make mechanical and electrical connection with the stacked semiconductor dies and/or wafers. In another implementation, buried oxide layer 204 may be entirely removed from structure 299 in FIG. 2H. As illustrated in FIG. 2H, interconnect metals 246A, 246B, 246C and 246D may be optionally formed on isolated deep substrate via 234 and contacts 236A, 236B and 236C, respectively.

Although only a single isolated deep substrate via 234 is formed in deep trench 224 in the present implementation, it should be understood that multiple isolated deep substrate vias may be formed in deep trench 224 according to an implementation of the present application. Also, although only a single deep trench 224 is shown in FIG. 2H in the present implementation, it should be understood that multiple deep trenches may be formed in structure 299, where each deep trench may include a single or multiple isolated deep substrate vias formed therein, according to an implementation of the present application. For example, a method of forming multiple isolated deep silicon vias in a single deep trench will be described in detail with reference to FIGS. 3A through 3G below.

Another approach to forming a structure having isolated deep substrate vias with decreased pitch and increased aspect ratio is shown and described below with respect to actions 188, 190, 194, 196, 198 and 199 of flowchart 100 in FIG. 1 and structures 388, 390, 394, 396, 398 and 399 in FIGS. 3A, 3B, 3C, 3D, 3E and 3F, respectively, according to one implementation of the present inventive concepts.

Figure 3A:
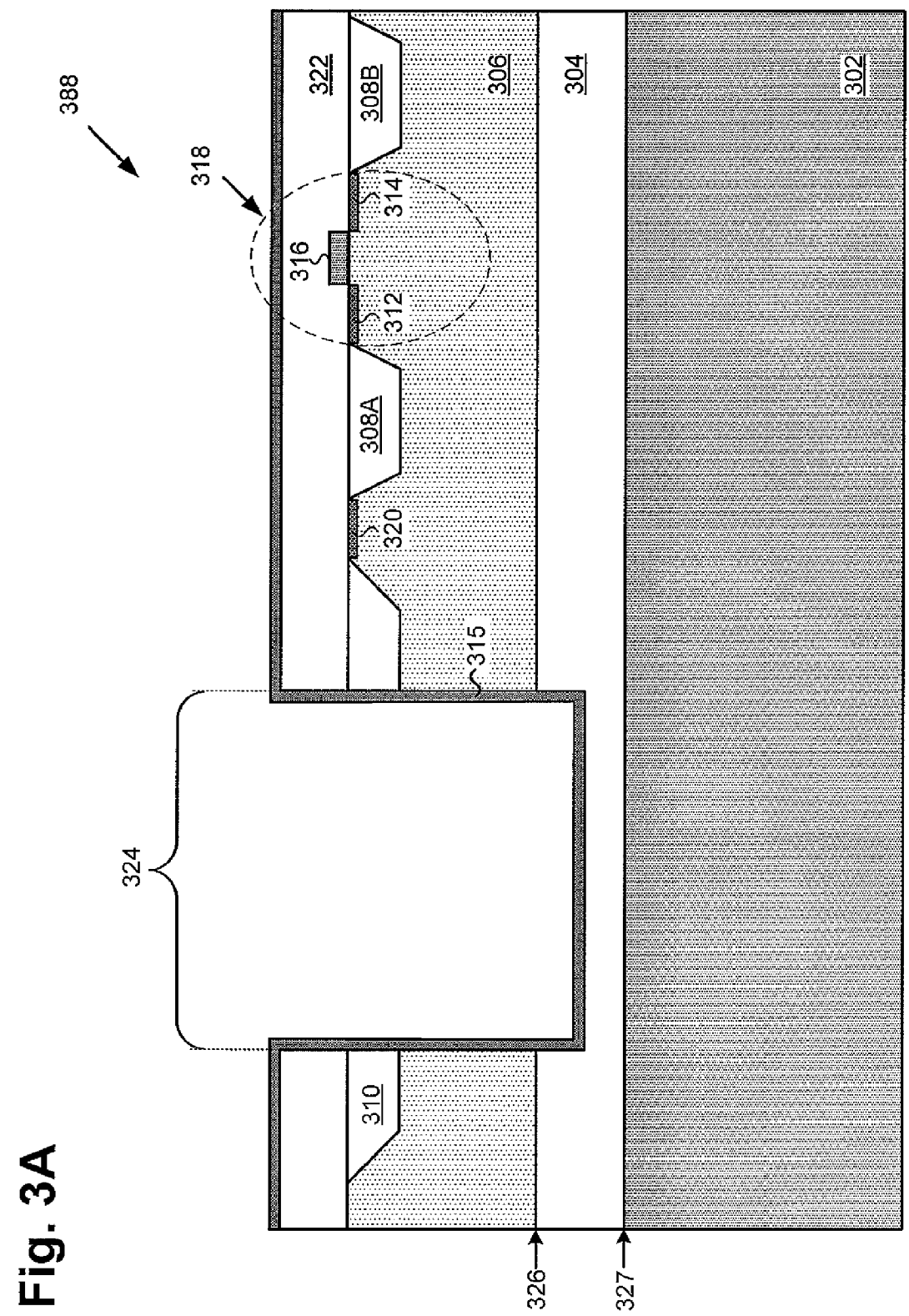
FIG. 3A illustrates a cross-sectional view of a portion of a structure having isolated deep substrate vias with decreased pitch and increased aspect ratio processed in accordance with an intermediate action in the flowchart of FIG. 1 according to one implementation of the present application.

Referring to action 188 in FIG. 1 and structure 388 in FIG. 3A, action 188 includes forming a deep trench extending through the insulative layer and the device layer, and terminating within the buried oxide layer. Action 188 also includes forming a first dielectric liner in the deep trench. As illustrated in FIG. 3A, with similar numerals representing similar features of structure 286 in FIG. 2C, structure 388 includes bulk semiconductor layer 302, buried oxide layer 304, device layer 306, isolation regions 308A, 308B and 310, active semiconductor device 318 and passive semiconductor device 320 in device layer 306, insulative layer 322 over device layer 306, and deep trench 324. For example, bulk semiconductor layer 302, buried oxide layer 304, device layer 306, isolation regions 308A, 308B and 310, active semiconductor device 318, passive semiconductor device 320, and insulative layer 322 may be formed by performing actions 182 and 184 of flowchart 100, as described with respect to structures 282 and 284 in FIGS. 2A and 2B above.

As illustrated in FIG. 3A, deep trench 324 extends through insulative layer 322, isolation region 310 and device layer 306, and terminates within buried oxide layer 304. In the present implementation, deep trench 324 has substantially parallel sidewalls and a flat bottom. For example, deep trench 324 can be formed by removing (e.g., etching away or cutting) portions of insulative layer 322, isolation region 310 and device layer 306, and a top portion of buried oxide layer 304.

It should be understood that the formation of deep trench 324 may involve using different etchants and/or methods to remove each of insulative layer 322, isolation region 310, device layer 306 and a top portion of buried oxide layer 304. Also, during the various etching actions, one or more deep trench masks (not explicitly shown in FIG. 3A) can be used to mask portions of insulative layer 322 over active semiconductor device 318, passive semiconductor device 320, isolation regions 308A and 308B, and portions of isolation region 310. After one or more etching actions, wet cleans may be performed to ensure that structure 388 has smooth and clean surfaces free from residues, impurities and other unwanted material.

In the present implementation, deep trench 324 extends below top surface 326 of buried oxide layer 304, but does not reach top surface 327 of bulk semiconductor layer 302, such that the remaining portion of buried oxide layer 304 under deep trench 324 can provide electrical and thermal isolation for isolated deep semiconductor vias subsequently formed in deep trench 324. Buried oxide layer 304 under deep trench 324 can also act as an etch stop layer to protect the isolated deep semiconductor vias subsequently formed in deep trench 324.

As illustrated in FIG. 3A, structure 388 includes first dielectric liner 315 formed in deep trench 324. First dielectric liner 315 lines the sidewalls and the bottom of deep trench 324. In the present implementation, first dielectric liner 315 is an oxide liner, such as a tetraethylorthosilicate (TEOS) liner. First dielectric liner 315 is configured to provide reliable isolation between subsequently formed isolated deep substrate vias and one or more wells (not explicitly shown in FIG. 3A), for example, of active semiconductor device 318 in device layer 306. In the present implementation, first dielectric liner 315 has a thickness in a range between 500-1000 angstroms (i.e., 500-1000*$10^{-10}$ meters). In another implementation, first dielectric liner 315 may have a thickness less than 500 angstroms or greater than 1000 angstroms.

Figure 3B:
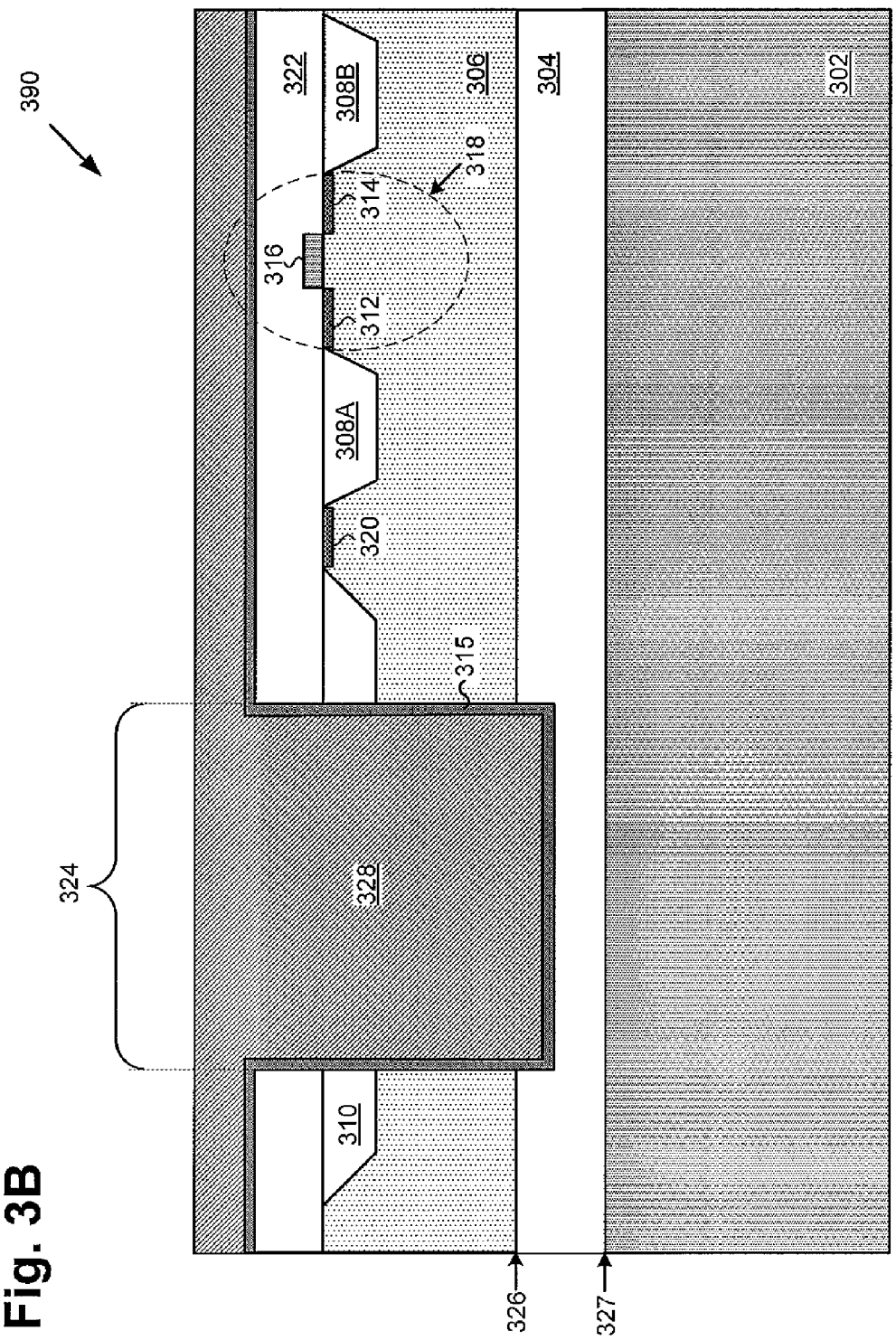
FIG. 3B illustrates a cross-sectional view of a portion of a structure having isolated deep substrate vias with decreased pitch and increased aspect ratio processed in accordance with an intermediate action in the flowchart of FIG. 1 according to one implementation of the present application.

Referring to action 190 in FIG. 1 and structure 390 in FIG. 3B, action 190 includes forming a dielectric filler in the deep trench, the dielectric filler filling the deep trench. As illustrated in FIG. 3B, structure 390 includes dielectric filler 328 formed over first dielectric liner 315 in deep trench 324 and over the top surface of insulative layer 322, where dielectric filler 328 fills the entire space in deep trench 324. Dielectric filler 328 may be formed by depositing an oxide using deposition methods such as chemical vapor deposition (CVD), high density plasma CVD, low pressure CVD, thermal CVD, or spin-coating, for example. In the present implementation, dielectric filler 328 includes silicon oxide or boron phosphorous doped tetraethylorthosilicate (TEOS). In other implementations, dielectric filler 328 may include other suitable dielectric materials. Dielectric filler 328 can provide mechanical rigidity for conductive fillers subsequently deposited in via holes formed therein.

Figure 3C:
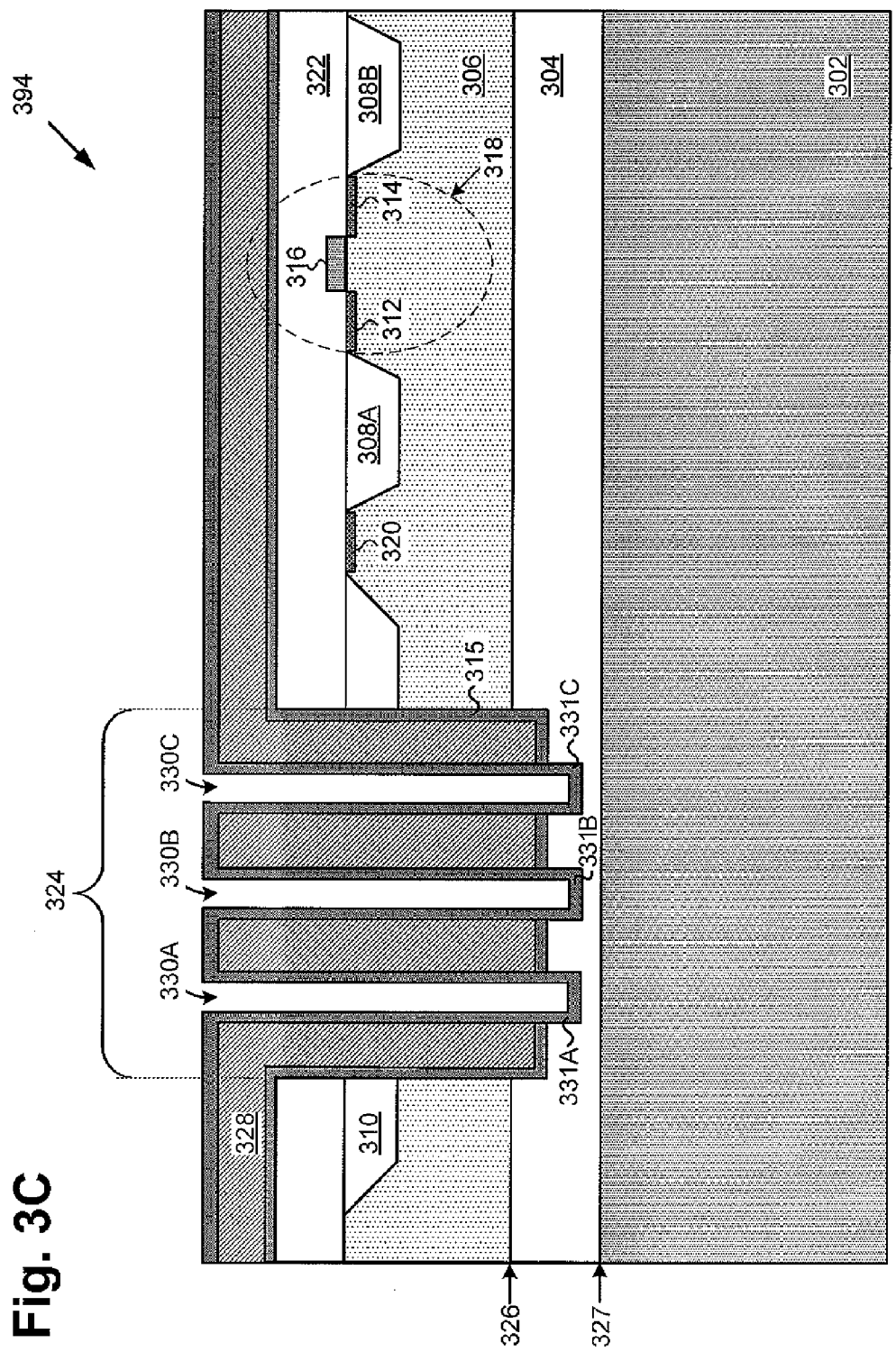
FIG. 3C illustrates a cross-sectional view of a portion of a structure having isolated deep substrate vias with decreased pitch and increased aspect ratio processed in accordance with an intermediate action in the flowchart of FIG. 1 according to one implementation of the present application.

Referring to action 194 in FIG. 1 and structure 394 in FIG. 3C, action 194 includes forming via holes in the dielectric filler, the via holes extending through the dielectric filler and the first dielectric layer, and terminating within the buried oxide layer, and forming a second dielectric liner in each of the via holes. As illustrated in FIG. 3C, structure 394 includes via holes 330A, 330B and 330C in dielectric filler 328, via holes 330A, 330B and 330C extending through dielectric filler 328 and first dielectric layer 315, and terminating within buried oxide layer 304. Structure 394 also includes second dielectric liners 331A, 331B and 331C in via holes 330A, 330B and 330C, respectively.

In contrast to conventional methods using different etchants and/or methods to remove different portions of a substrate having different compositions to form via holes, in the present implementation, because dielectric filler 328 in deep trench 324, first dielectric liner 315, buried oxide layer 304 have substantially similar compositions, in the present implementation, the etching process can be well controlled to form via holes with fine dimensions. In the present implementation, via holes 330A, 330B and 330C may each have a critical dimension width of approximately equal to or less than 1.0 microns, and a critical dimension depth of approximately equal to or greater than 5.0 microns, such that isolated deep substrate vias subsequently formed in via holes 330A, 330B and 330C may have a high aspect ratio of approximately equal to or greater than 5:1. In the present implementation, via holes 330A, 330B and 330C each include substantially parallel sidewalls and a flat bottom.

Thereafter, second dielectric liners 331A, 331B and 331C are formed in via holes 330A, 330B and 330C, respectively. Second dielectric liners 331 is also formed over a top surface of dielectric filler 328. Each of second dielectric liners 331A, 331B and 331C lines the respective sidewalls and the bottom of via holes 330A, 330B and 330C. In the present implementation, second dielectric liners 331A, 331B and 331C each include an oxide liner, such as a tetraethylorthosilicate (TEOS) liner. Second dielectric liners 331A, 331B and 331C are configured to provide reliable isolation between subsequently formed isolated deep substrate vias and one or more wells (not explicitly shown in FIG. 3C), for example, of active semiconductor device 318 in device layer 306. In the present implementation, second dielectric liners 331A, 331E and 331C each have a thickness in a range between 500-1000 angstroms (i.e., $500\text{-}1000*10^{-10}$ meters). In another implementation, second dielectric liners 331A, 331B and 331C may each have a thickness less than 500 angstroms or greater than 1000 angstroms.

Figure 3D:
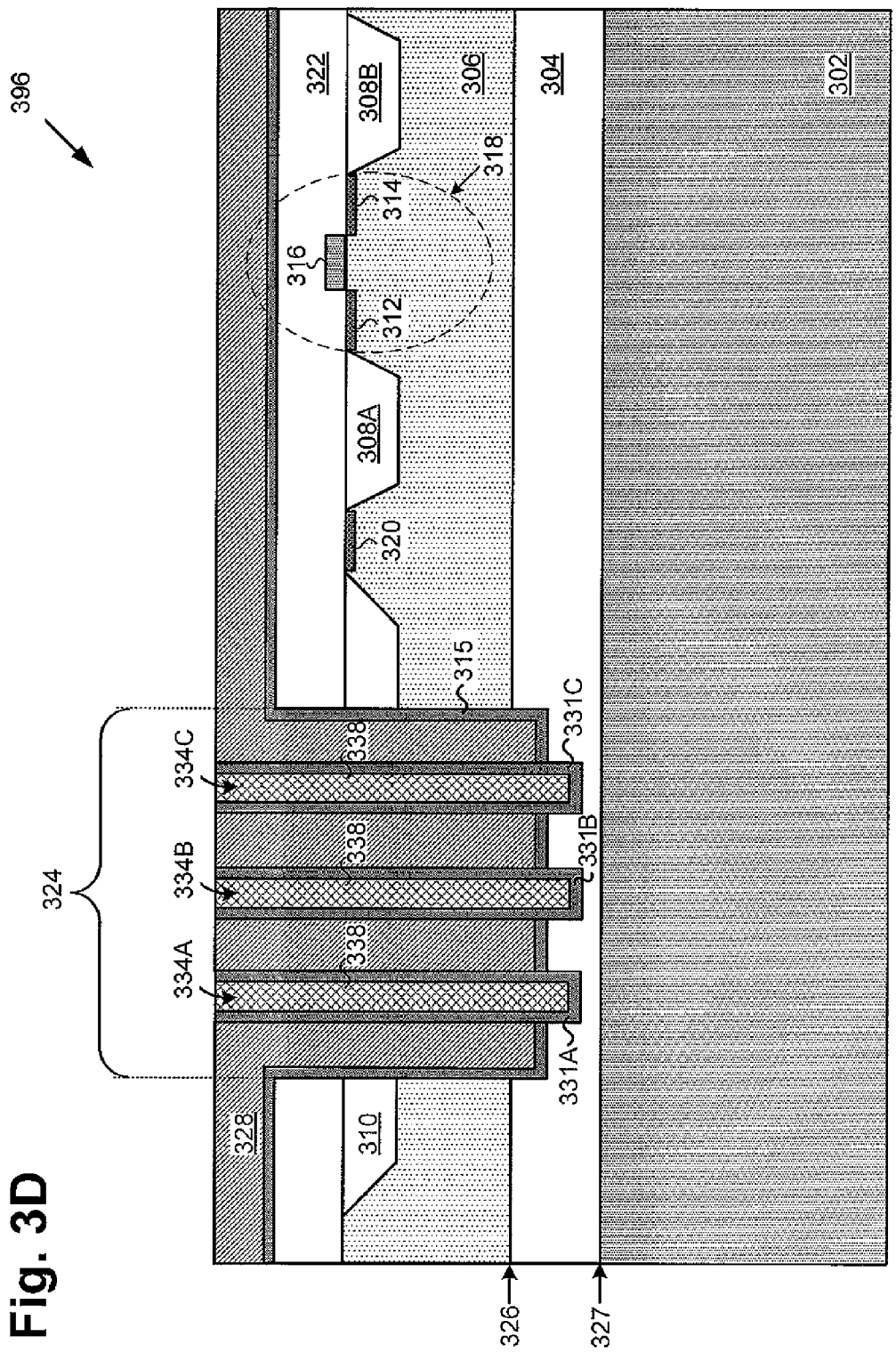
FIG. 3D illustrates a cross-sectional view of a portion of a structure having isolated deep substrate vias with decreased pitch and increased aspect ratio processed in accordance with an intermediate action in the flowchart of FIG. 1 according to one implementation of the present application.

Referring to action 196 in FIG. 1 and structure 396 in FIG. 3D, action 196 includes depositing conductive fillers in the via holes surrounded by the dielectric filler to form isolated deep substrate vias in the deep trench. As illustrated in FIG. 3D, structure 396 includes conductive fillers 338 deposited in via holes 330A, 330B and 330C. In the present implementation, conductive fillers 338 in via holes 330A, 330B and 330C are in direct contact with second dielectric liners 331A, 331B and 331C, respectively, and surrounded by dielectric filler 328 in deep trench 324, thus forming isolated deep substrate vias 334A, 334B and 334C. In the present implementation, conductive fillers 338 in via holes 330A, 330B and 330C include metallic material, such as tungsten or copper. In other implementations, conductive fillers 338 in via holes 330A, 330B and 330C may include other suitable conductive materials. Second dielectric liner 331 may be completely removed from the top surface of dielectric filler 328 during the formation of conductive fillers 338 using processing actions such as chemical mechanical polishing (CMP).

Figure 3E:
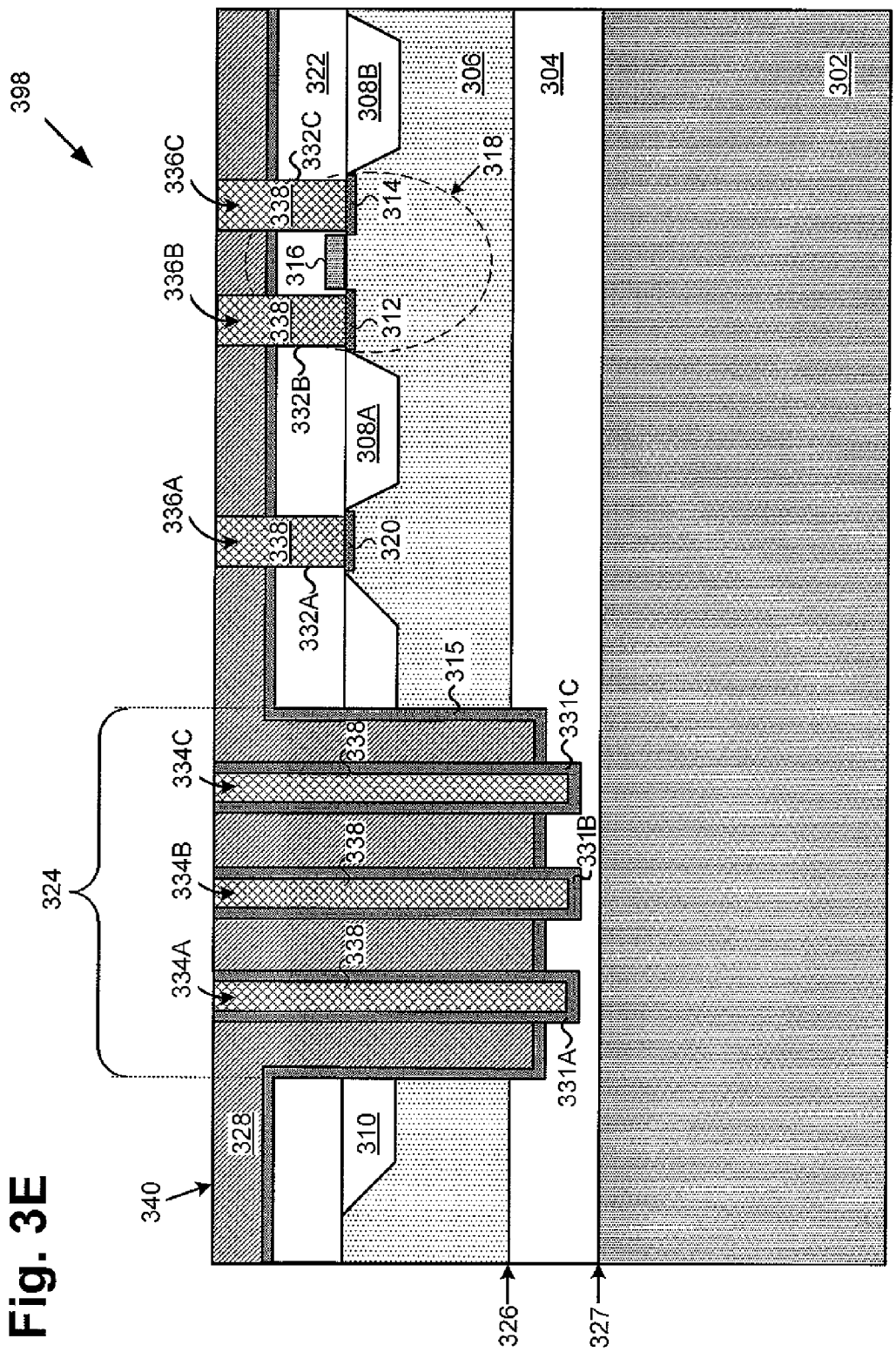
FIG. 3E illustrates a cross-sectional view of a portion of a structure having isolated deep substrate vias with decreased pitch and increased aspect ratio processed in accordance with an intermediate action in the flowchart of FIG. 1 according to one implementation of the present application.

Referring to action 198 in FIG. 1 and structure 398 in FIG. 3E, action 198 includes forming contacts for one or more semiconductor devices in the device layer. As illustrated in FIG. 3E, structure 398 includes contact 336A for passive semiconductor device 320, and contacts 336B and 336C for active semiconductor device 318. Contact hole 332A extends through dielectric filler 328, first dielectric liner 315 and insulative layer 322, and reaches a top surface of passive semiconductor device 320. Contact holes 332B and 332C extend through dielectric filler 328, first dielectric liner 315 and insulative layer 322, and reach respective top surfaces of source 312 and drain 314 of active semiconductor device 318. It is noted that the formation of contact holes 332A, 332B and 332C may require a different mask than the one used to form via holes 330A, 330B and 330C. After one or more etching actions, wet cleans may be performed to ensure that contact holes 332A, 332B and 332C have smooth and clean surfaces free from residues, impurities and other unwanted material.

As illustrated in FIG. 3E, conductive fillers 338 are deposited in contact holes 332A, 332B and 332C. In the present implementation, conductive fillers 338 in contact holes 332A, 332B and 332C are in direct contact with passive semiconductor device 320, source 312 and drain 314 of active semiconductor device 318, respectively. Conductive fillers 338 in contact holes 332A, 332B and 332C are isolated from one another by dielectric filler 328, first dielectric liner 315 and insulative layer 322, thus forming respective contacts 336A, 336B and 336C.

In the present implementation, conductive fillers 338 in contact holes 332A, 332B and 332C each include a metallic material, such as tungsten or copper. In the present implementation, conductive fillers 338 in via holes 330A, 330B and 330C and conductive fillers 338 in contact holes 332A, 332B and 332C are formed in different deposition actions, and include different conductive materials. In another implementation, conductive fillers 338 in via holes 330A, 330B and 330C and conductive fillers 338 in contact holes 332A, 332B and 332C may be deposited during a single deposition action using the same conductive material. A chemical mechanical polish (CMP) and cleaning may be carried out to remove excess conductive fillers 338 as well as one or more photoresist masks (not explicitly shown in FIG. 3E) used during the deposition of conductive fillers 338. As illustrated in FIG. 3E, isolated deep substrate vias 334A, 334B and 334C, first dielectric liner 315, contacts 336A, 336B and 336C and dielectric filler 328 have coplanar top surface 340. In one implementation, isolated deep substrate vias 334A, 334B and 334C may be electrically and mechanically coupled to one or more semiconductor devices, such as active semiconductor device 318 in FIG. 3E.

In another implementation, once via holes 330A, 330B and 330C are formed in structure 394 in FIG. 3C, where via holes 330A, 330B and 330C each extend through dielectric filler 328 and first dielectric liner 315 and terminate within buried oxide layer 304, conductive fillers 338 are deposited in via holes 330A, 330B and 330C. A CMP action may be performed to planarize conductive fillers 338 in via holes 330A, 330B and 330C. Thereafter, contact holes 332A, 332B and 332C may be formed, for example, by etching through dielectric filler 328, first dielectric liner 315 and insulative layer 322, to reach the respective top surfaces of passive semiconductor device 320, and source 312 and drain 314 of active semiconductor device 318. Thereafter, conductive fillers 338 are formed in contact holes 332A, 332B and 332C, which are then polished by another CMP action to form structure 398 in FIG. 3E.

Figure 3F:
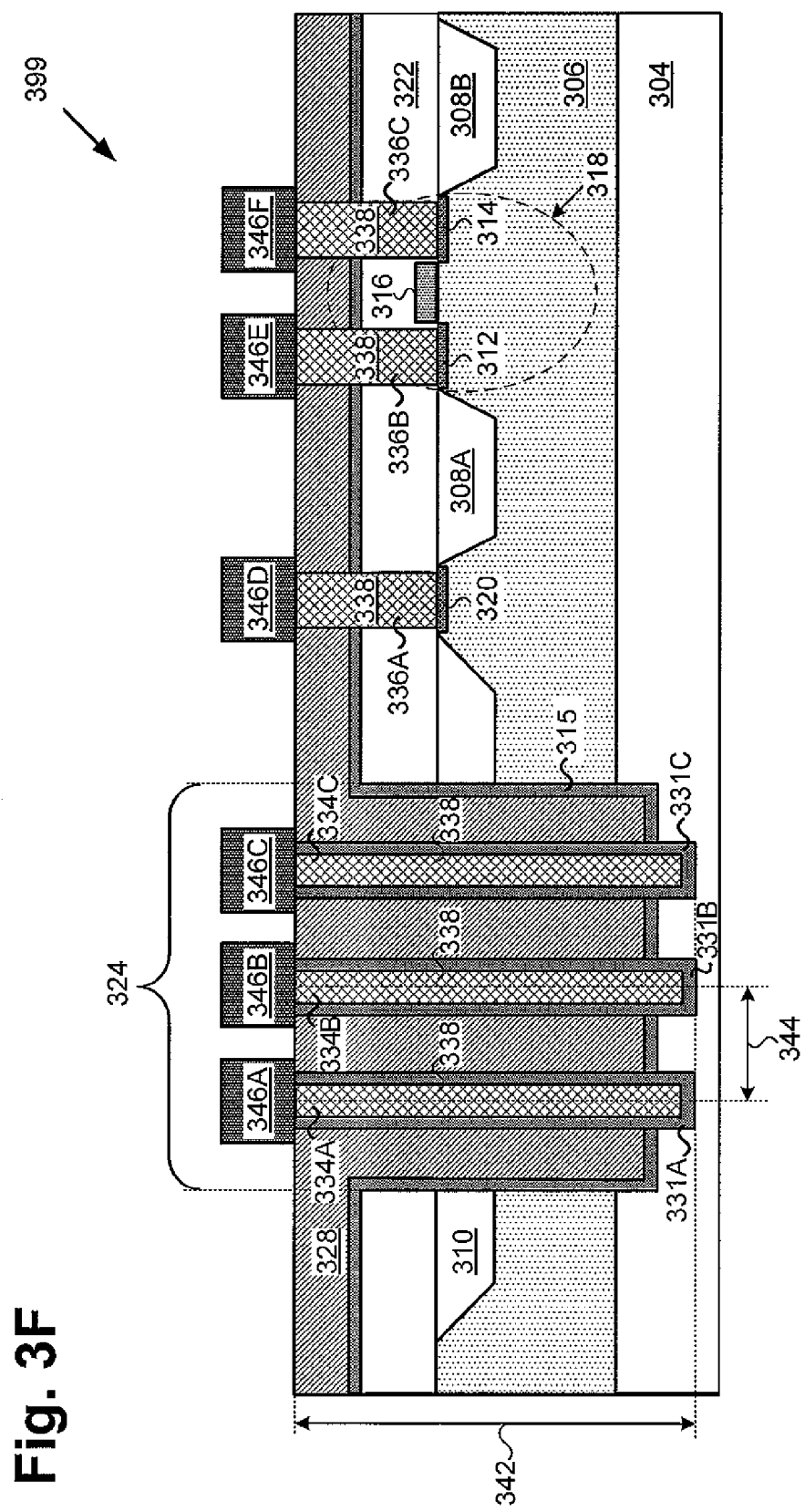
FIG. 3F illustrates a cross-sectional view of a portion of a structure having isolated deep substrate vias with decreased pitch and increased aspect ratio processed in accordance with a final action in the flowchart of FIG. 1 according to one implementation of the present application.

Referring to action 199 in FIG. 1 and structure 399 in FIG. 3F, action 199 includes optionally removing the bulk semiconductor layer and forming interconnect metals. As illustrated in FIG. 3F, structure 399 includes buried oxide layer 304, device layer 306 formed over buried oxide layer 304, isolation regions 308A, 308B and 310, active semiconductor device 318 and passive semiconductor device 320 formed in device layer 306, insulative layer 322 over device layer 306, isolated deep substrate vias 334A, 334B and 334C each surrounded by second dielectric liners 331A, 331B and 331C, respectively, dielectric filler 328 and first dielectric liner 315 in deep trench 324, and contacts 336A, 336B and 336C coupled to passive semiconductor device 320, source 312 and drain 314 of active semiconductor device 318, respectively, and interconnect metals 346A, 346B, 346C, 346D, 346E and 346F. Bulk semiconductor layer 302 in structure 398 of FIG. 3E is removed from structure 399 in FIG. 3F. It should be understood that, in a case where structure 398 in FIG. 3F is a SOT wafer at the bottom of a 3D stacked structure, bulk semiconductor layer 302 does not need to be removed from structure 398 in FIG. 3F.

In one implementation, bulk semiconductor layer 302 can be removed by etching from the bottom of structure 398 in FIG. 3F, where buried oxide layer 304 can act as an etch stop layer and protect device layer 306. In another implementation, bulk semiconductor layer 302 can be removed by grinding the bottom surface of bulk semiconductor layer 302 in structure 398 in FIG. 3F, for example using coarse removal methods such as grinding wheel and followed by fine removal methods such as wet or dry chemical processing.

As illustrated in FIG. 3F, isolated deep substrate vias 334A, 334B and 334C extend below deep trench 324 and terminate within buried oxide layer 304. In the present implementation, isolated deep substrate vias 334A, 334B and 334C do not extend through the entire thickness of structure 399 such that isolated deep substrate vias 334A, 334B and 334C are electrically and thermally isolated by buried oxide layer 304 below deep trench 324. As such, isolated deep substrate vias 334A, 334B and 334C are exposed only at the top surface of structure 399. In one implementation, structure 399 can be stacked with other semiconductor dies and/or wafers (not explicitly shown in FIG. 3F) on its top and/or bottom surfaces, where isolated deep substrate vias 334A, 334B and 334C are configured to make mechanical and electrical connections with semiconductor dies and/or wafers at the top surface of structure 398. In another implementation, portions of second dielectric liners 331A, 331B and 331C at the bottom of isolated deep substrate vias 334A, 334B and 334C, respectively, and portions of buried oxide layer 304 may be removed from structure 399 in FIG. 3F to expose conducting portions of isolated deep substrate vias 334A, 334B and 334C at the bottom of structure 399. As illustrated in FIG. 3F, interconnect metals 346A, 346B, 346C, 346D, 346E and 346F may be optionally formed on isolated deep substrate vias 334A, 334B and 334C and contacts 336A, 336B and 336C, respectively.

In the present implementation, pitch 344, a distance between the middle of isolated deep substrate via 334A and the middle of isolated deep substrate via 334B, is of a value in a range of approximately 0.3-1.0 microns. In other implementations, pitch 344 may be less than approximately 0.3 microns or greater than approximately 1.0 microns. In the present implementation, depth 342 of isolated deep substrate vias 334A, 334B and 334C is in a range of approximately 4.0-5.0 microns. In other implementations, depth 342 may be less than approximately 4.0 microns or greater than approximately 5.0 microns. In the present implementation, isolated deep substrate vias 334A, 334B and 334C each have a width of approximately 0.5 microns. In other implementations, isolated deep substrate vias 334A, 334B and 334C may each have a width greater or less than approximately 0.5 microns.

Figure 3G:
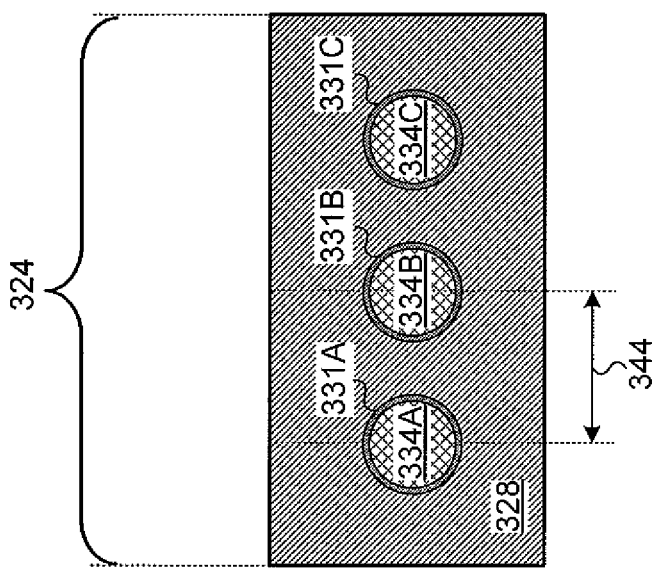
FIG. 3G illustrates a top plan view of a portion of a structure having isolated deep substrate vias with decreased pitch and increased aspect ratio according to one implementation of the present application.

Turning to FIG. 3G, FIG. 3G shows a top plan view of a portion of a structure having isolated deep substrate vias with decreased pitch and increased aspect ratio according to one implementation of the present application. As illustrated in FIG. 3G, with similar numerals representing similar features in FIG. 3E, FIG. 3G illustrates isolated deep substrate vias 334A, 334B and 334C each surrounded by respective second dielectric liners 331A, 331B and 331C, and by dielectric filler 328 in deep trench 324, where the isolated deep substrate vias are equally spaced from one another. For example, pitch 344 between the middle of isolated deep substrate via 334A and the middle of isolated deep substrate via 334B is of a value in a range of approximately 0.3-1.0 microns. In another implementation, multiple columns of isolated deep substrate vias may be formed in deep trench 324, and electrically coupled to semiconductor devices, for example, in device layer 306 in structure 398 of FIG. 3E.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A structure comprising:
a device layer over a buried oxide layer;
a deep trench extending entirely through said device layer and partially through said buried oxide layer;
a dielectric filler located in said deep trench;
a plurality of via holes, each extending entirely through said dielectric filler and only partially through said buried oxide layer;
conductive fillers located in said via holes, wherein said conductive fillers form isolated deep substrate vias that extend entirely through said dielectric filler and only partially through said buried oxide layer.

2. The structure of claim 1 further comprising a dielectric liner in each of said via holes.

3. The structure of claim 1 wherein said dielectric filler comprises silicon oxide.

4. The structure of claim 1 wherein said conductive fillers comprise tungsten or copper.

5. The structure of claim 1 wherein an adjacent pair of said isolated deep substrate vias within said deep trench has a pitch equal to or less than 1.0 microns.

6. The structure of claim 1, wherein at least one semiconductor device and isolation regions are formed in the device layer.

7. The structure of claim 1, further comprising:
a first dielectric liner in said deep trench; and
a second dielectric liner in said one or more via holes.

8. The structure of claim 7, wherein the dielectric filler, first dielectric liner and buried oxide layer have substantially similar compositions.

9. The structure of claim 1, wherein a pitch between the plurality of conductive fillers is in a range of 0.3 to 1.0 microns.

10. The structure of claim 1, wherein the device layer is silicon having a thickness of at least 1.0 microns.

11. The structure of claim 1, wherein each of the deep substrate vias has an aspect ratio equal to or greater than 5:1.

12. A method for forming isolated deep substrate vias, said method comprising:
forming a buried oxide layer over a bulk semiconductor layer, and a device layer over said buried oxide layer;
forming a field effect transistor (FET) in the device layer, the FET including a source, a drain and a gate located at an upper surface of the device layer, wherein the buried oxide layer is located at a lower surface of the device layer;
forming a deep trench extending through said device layer, wherein the deep trench is formed starting from the upper surface of the device layer and proceeding to the lower surface of the device layer, wherein said deep trench extends through said device layer and terminates within said buried oxide layer;
forming a dielectric filler in said deep trench;
forming via holes in said dielectric filler;
forming conductive fillers in said via holes to form said isolated deep substrate vias.

13. A method for forming isolated deep substrate vias, said method comprising:
forming a buried oxide layer over a bulk semiconductor layer, and a device layer over said buried oxide layer;
forming a field effect transistor (FET) in the device layer, the FET including a source, a drain and a gate located at an upper surface of the device layer, wherein the buried oxide layer is located at a lower surface of the device layer;

forming a deep trench extending through said device layer, wherein the deep trench is formed starting from the upper surface of the device layer and proceeding to the lower surface of the device layer;

forming a dielectric filler in said deep trench;

forming via holes in said dielectric filler wherein said via holes extend through said deep trench and terminate within said buried oxide layer; and forming conductive fillers in said via holes to form said isolated deep substrate vias.

* * * * *